United States Patent
Bedarida et al.

(10) Patent No.: US 6,624,683 B1
(45) Date of Patent: Sep. 23, 2003

(54) THRESHOLD VOLTAGE REDUCTION OF A TRANSISTOR CONNECTED AS A DIODE

(75) Inventors: Lorenzo Bedarida, Vimercate (IT); Fabio Disegni, Aix en Provence (IT); Vincenzo Dima, Monza (IT); Simone Bartoli, Cambiago (IT)

(73) Assignee: STMicroelctronics S.r.l., Agrate Brianza (IT)

( * ) Notice: Subject to any disclaimer, the term of this patent is extended or adjusted under 35 U.S.C. 154(b) by 0 days.

(21) Appl. No.: 09/620,430

(22) Filed: Jul. 20, 2000

(30) Foreign Application Priority Data

Jul. 21, 1999 (EP) .............................................. 99830467

(51) Int. Cl.⁷ .............................................. H03K 17/04
(52) U.S. Cl. ..................... 327/374; 327/377; 327/427; 327/580; 327/581
(58) Field of Search ............................... 327/104, 574, 327/576, 580, 581, 583, 427, 434, 308, 307, 313, 314, 325, 374, 377, 376, 538, 541, 543

(56) References Cited

U.S. PATENT DOCUMENTS

| | | | |
|---|---|---|---|
| 4,139,935 A | | 2/1979 | Bertin et al. .................. 29/571 |
| 4,417,164 A | * | 11/1983 | Edlund ....................... 327/581 |
| 4,492,883 A | * | 1/1985 | Janutka ....................... 327/377 |
| 4,897,565 A | * | 1/1990 | Shimizu ....................... 327/541 |
| 5,162,966 A | * | 11/1992 | Fujihira ....................... 257/140 |
| 5,506,527 A | * | 4/1996 | Rudolph et al. ............. 327/104 |
| 5,646,808 A | * | 7/1997 | Nakayama ....................... 361/56 |
| 6,040,735 A | * | 3/2000 | Park et al. .................... 327/541 |
| 6,043,701 A | * | 3/2000 | Schrittesser ................. 327/375 |

FOREIGN PATENT DOCUMENTS

DE  196 29 056  7/1996

* cited by examiner

Primary Examiner—Terry D. Cunningham
Assistant Examiner—Long Nguyen
(74) Attorney, Agent, or Firm—Wolf, Greenfield & Sacks, P.C.

(57) ABSTRACT

A circuit design of a transistor connected as a diode, in particular to a design able to reduce the threshold voltage of the transistor and equal to the difference of the threshold voltage of the used transistors in the circuit disposal. The circuit design includes a first pMOS transistor having a second nMOS transistor connected as a diode connected between the gate and the drain of the first transistor and a current generator connected to the gates of the two transistors. Such a circuit design is also applicable to a nMOS transistor. From a general point of view the invention is directed to a nMOS or pMOS transistor whose gate voltage is increased (for the nMOS transistors) or decreased (for the pMOS transistors) by using a circuit in series with the gate that provides an appropriate delta of voltage. 3)

8 Claims, 2 Drawing Sheets

THRESHOLD VOLTAGE REDUCTION OF A TRANSISTOR CONNECTED AS A DIODE

BACKGROUND OF THE INVENTION

1. Field of the Invention

The present invention refers to a circuit design of a transistor connected as a diode, in particular to a design able to reduce the threshold voltage of the transistor.

Moreover, the present invention refers to a method for reducing the threshold voltage of the transistor connected as a diode.

2. Discussion of the Related Art

The trend in transistor design is toward devices that work with lower and lower supply voltages.

One of the significant design limitations is that related to the threshold voltage of the MOS transistors. The threshold voltage of a transistor depends on the minimum voltage achieved with the kind of process used.

In particular, the threshold voltage of the transistors connected as a diode, used widely in integrated circuits, represent a significant limit for the circuits such as current mirrors, sense amplifiers, and charge pumps.

At the decreasing of the supply voltage a lot of the classic structures of such kind, that use transistors connected as a diode, cannot work in a proper way any more.

SUMMARY OF THE INVENTION

The aim of the present invention is to reduce the threshold voltage of transistors connected as a diode.

The basic idea to reach such aim is to reduce the threshold voltage of a transistor applying a voltage generator in series to the control terminal of said transistor in a way that the difference of the transistor threshold voltage and of the voltage generator is smaller than the threshold voltage of the transistor.

From a general point of view this invention refers to a nMOS or pMOS transistor whose gate voltage is increased (for the nMOS transistors) or decreased (for the pMOS transistors) by using a circuit in series with the gate that provides an opportune delta of voltage.

According to a first aspect, the present invention is directed to a circuit design comprising a transistor having a control terminal, a first terminal connected to a first potential, a second terminal connected to a second potential, a voltage generator able to provide a prefixed value of voltage having a third terminal and a fourth terminal, said third terminal is connected to said control terminal and said fourth terminal is connected to said first terminal.

According to a second aspect, the present invention is directed to a method for reducing the threshold voltage of a transistor connected as a diode having a gate terminal to which it is associated a threshold voltage that provides the application of a voltage in series to the gate terminal of said transistor.

Achieving a circuit design able to reduce, to a predetermined value, the threshold voltage of the equivalent transistor connected as a diode, and in an embodiment of the present invention equal to the difference of the threshold voltage of the transistors used in the circuit design, has great advantage in all circuits in which a lower voltage threshold with respect to the one offered by conventional building processes.

BRIEF DESCRIPTION OF THE DRAWINGS

The features and the advantages of the present invention will be made evident by the a following detailed description of its preferred embodiment, illustrated as a non-limiting example in the annexed drawings, wherein.

DETAILED DESCRIPTION

Figure 1:
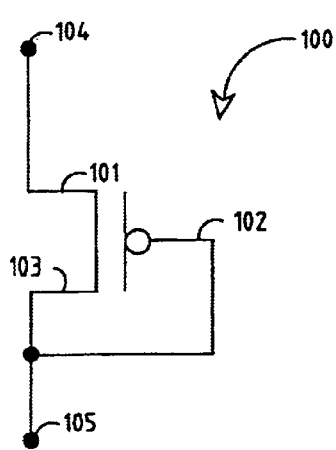
FIG. 1 shows a MOS transistor of p type connected as a diode according to the known art.

In FIG. 1, a pMOS transistor 100 is connected as a diode. It has a gate terminal 102 connected to a drain terminal 103 and to an external terminal 105 to which a voltage VB is applied. The transistor 100 has also a source terminal 101 connected to an external terminal 104 to which is applied a voltage VDD. For the working of the circuit the voltage VB must be lesser than voltage VDD less the threshold voltage of the transistor 100. The voltages VB and VDD can be also any internal voltage of the device.

Figure 2:
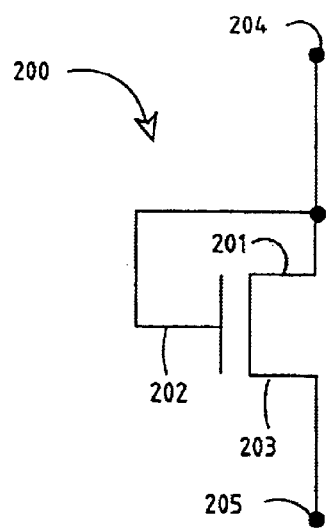
FIG. 2 shows a MOS transistor of n type connected as a diode according to the known art.

In FIG. 2 a nMOS transistor is connected as a diode. It has a gate terminal 202 connected to a drain terminal 201 and to an external terminal 204 to which a voltage VAA is applied. The transistor 200 has also a source terminal 203 connected to an external terminal 205 to which a voltage VBB is applied. For the working of the circuit, the voltage VAA must be greater than voltage VBB less the threshold voltage of the transistor 200. The voltages VAA and VBB can be also any internal voltage of the device.

In these two configurations, at the two external terminals of the transistors 100 and 200, the behavior is equal to that of two diodes having a threshold voltage equal to the transistors themselves. Clearly, under said voltage threshold the devices are turned off.

Figure 3:
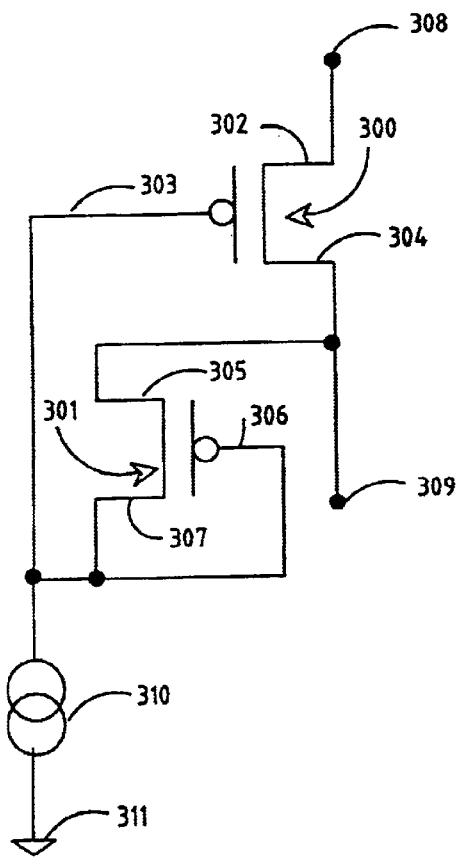
FIG. 3 shows a circuit design comprising a MOS transistor of p type according to a first embodiment of the present invention.

For example, the transistor 100, having a threshold voltage VT1, stays in conduction if $VB < VDD - VT1$ In an analogous way, the transistor 200, being VAA and VBB the generic voltages applied respectively on the drain and on the source, is in conduction if $VBB < VAA - VT$ In FIG. 3 an embodiment of the present invention is shown.

A pMOS transistor 300 having a source 302 connected to an external terminal 308 to which a voltage VDD is applied, a drain 304 connected to an external terminal 309 to which a voltage VB is applied, and a gate 303 connected to the drain terminal 307 and the gate 306 of another pMOS transistor 301. The source terminal 305, of the transistor 301, is connected to the drain terminal 304 of the transistor 300. The gate 303 is also connected to a current generator 310 terminal, the other terminal of the current generator 310 is connected to the external terminal 311 connected to the voltage VNN (in the figure it is connected to the ground terminal).

In practice the circuit design of FIG. 3, makes provision for a first transistor 300 having a second transistor 301, connected as diode, placed between the gate 303 (cathode of the diode) and the drain 304 (anode of the diode) of the first transistor 300 and a current generator having a terminal connected to the two gates 303 and 306 of the two transistors 300 and 301. The equivalent diode is that seen from the external terminals 308 and 309.

By means of using a process which makes provision for the possibility to build transistors having different thresholds (for example at low voltage and at high voltage) it is possible to achieve an equivalent transistor connected as a diode with a threshold equal to the difference of the thresholds of the used transistors.

The transistor 300 has associated a threshold VT2 and the transistor 301 has associated a threshold VT1. The threshold voltage VT2, in absolute value, is greater than the threshold voltage VT1. With the circuit disposal shown in FIG. 3 an equivalent transistor connected as a diode having a threshold voltage equal to VT2−VT1 is obtained.

When the potential VB applied to the terminal 309 increases, the potential VA of the gate terminal 303 also increases and it is equal to VB−VT1, that is $$VA = VB-VT1$$

The transistor 300 stays in conduction until $$VDD-VA-VT2>0$$

which becomes $$VDD-(VB-VT1)-VT2>0$$

from which $$VB<VDD-(VT2-VT1)$$

which compared with the equivalent relation relevant to the transistor 100, and that is $$VB<VDD-VT1$$

to note as in the case of FIG. 3 it is obtained an equivalent transistor with lower threshold and equal to the difference of the threshold voltage of the two transistors.

Therefore choosing appropriately the threshold voltages of the two transistors it is possible to obtain a threshold voltage value predetermined and included between 0 and the maximum threshold obtainable with the used process.

The transistor 300 stays in saturation as long as the current generator 310 is dimensioned as to maintain the transistor 301 in conduction, satisfying the saturation condition of the transistor 300 which is $$VB-VA<VT2$$

where VB−VA is almost equal to a VT1 if the current generator 310 is appropriately dimensioned, therefore seen that $$VT2>VT1$$

the above written saturation condition is surely satisfied.

The current generator 310, connected to the VNN potential, supplies a current of the appropriate sign, to bias the transistor 301, so that it could be correctly in conduction.

Figure 4:
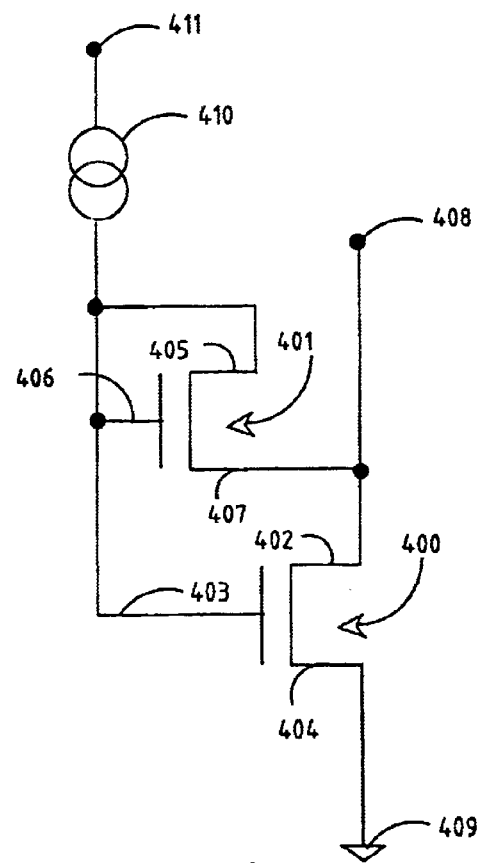
FIG. 4 shows a circuit design comprising a MOS transistor of n type according to a second embodiment of the present invention.

Such a circuit design is also applicable to MOS transistors of n type, as it can be seen in the FIG. 4.

A nMOS transistor 400 having a drain 402 connected to an external terminal 408 to which a voltage VA is applied, a source 404 connected to an external terminal 409 connected to a VBB potential (in the figure connected to the ground terminal), and a gate 403 connected to the gate terminal 406 and of drain 405 of an other transistor nMOS 401. The source terminal 407 of the transistor 401 is connected to a drain terminal 402 of the transistor 400. The gate 406 is also connected to a current generator terminal 410, the other terminal of the current generator 410 is connected to an external terminal 411 to which a voltage VPP is applied (with VPP>VA).

The transistor 400 has associated a threshold VT2 and the transistor 401 has associated a threshold VT1. The threshold voltage VT2 is bigger than the threshold voltage VT 1. Called VAA the voltage on the gate 403, the transistor 400 is in conduction if it is satisfied the following relation $$VAA >VT2$$

which becomes $$VT1+VA >VT2$$

from which $$VA>VT2-VT1$$

Note that fixed the generic voltage VA on the external terminal 408, the equivalent diode (between the terminals 408 and 409) is in conduction until, being VBB the generic voltage on the terminal 409, is $$VBB<VA-(VT2-VT1)$$

The current generator 410, connected to the VPP potential, supplies a current of the opportune sign, to bias the transistor 401, so that it can be correctly in conduction.

Besides the transistor 400 works in a saturation zone being verified the condition $$VDS<VGS-VT2$$

which becomes $$VA>VT1+VA-VT2$$

which is always verified if VT2>VT1.

If VT1 is very close to VT2 the working point of the transistor 400 will be on the border between the saturation region and the triode region.

In the practical application of the configuration of the FIG. 3, the equivalent transistor connected as a diode, having a lower threshold voltage, is that seen on the external terminals 308 and 309, biased so as to have the potential applied to the node 309 greater than the potential applied to the node 309.

Figure 5:
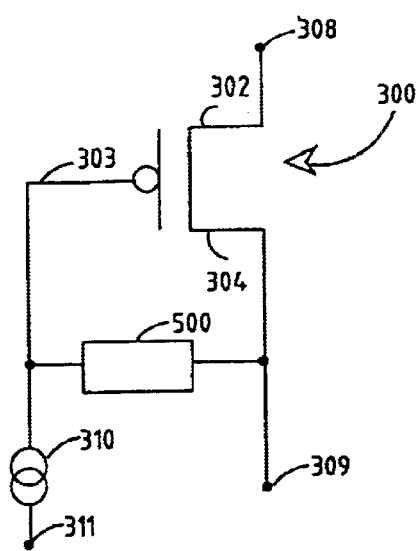
FIG. 5 shows a circuit design comprising a MOS transistor of p type according to a third embodiment of the present invention.

In alternative to the transistor pMOS 301, connected as a diode and represented in the FIG. 5 by a block 500 connected to the terminals 304 and 303, it is possible to use a nMOS transistor connected as a diode (gate and drain connected to the terminal 304 and source connected to the terminal 303), or however a diode having its anode connected to the terminal 304 and its cathode connected to the terminal 303. Besides, it is possible to use a resistance of the appropriate value, always applied between the nodes 304 and 303. The value of the resistance and of the current generator 310 must be determined so as to make fall the voltage value (VT1) on the resistance which will be subtracted from the transistor 300 voltage threshold.

In the practical application of the configuration of FIG. 4, the transistor equivalent connected as a diode, having a lower threshold voltage is that seen from the external terminals 408 and 409, biased so as to have the potential applied to the node 408 greater than the potential applied to the node 409.

Figure 6:
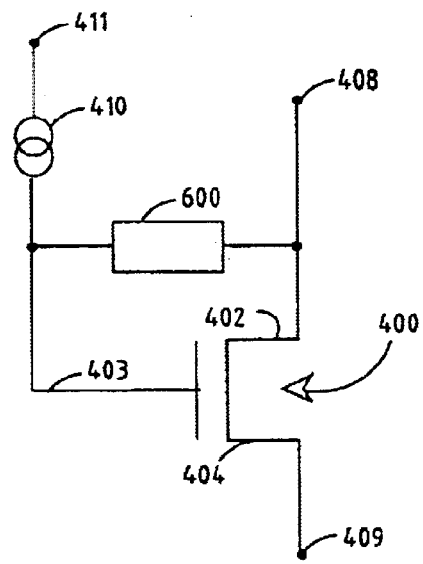
FIG. 6 shows a circuit design comprising a MOS transistor of n-type according to a fourth embodiment of the present invention.

In alternative to the nMOS transistor 401, connected as a diode represented in FIG. 6 by a block 600 connected to the terminals 402 and 403, it is possible to use a pMOS transistor connected as a diode (gate and drain connected to the terminal 402 and source connected to the terminal 403), or however a diode having its anode connected to the terminal 403 and its cathode connected to the terminal 402. Besides, it is possible to use a resistance of the appropriate value, always applied between the nodes 403 and 402. The value of the resistance and of the current generator 410 must be determined so as to make fall the voltage value (VT1) on the resistance which will be subtracted from the value of the transistor 400 voltage threshold.

Figure 7:
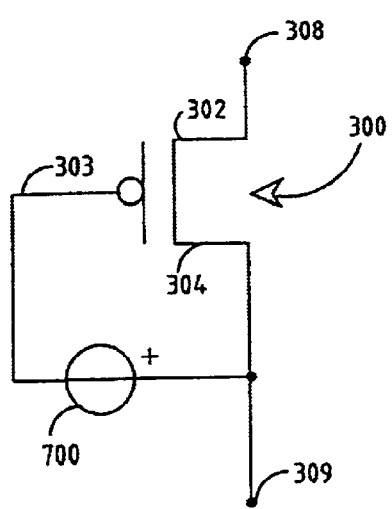
FIG. 7 shows a circuit design comprising a MOS transistor of p-type according to a fifth embodiment of the present invention.
Figure 8:
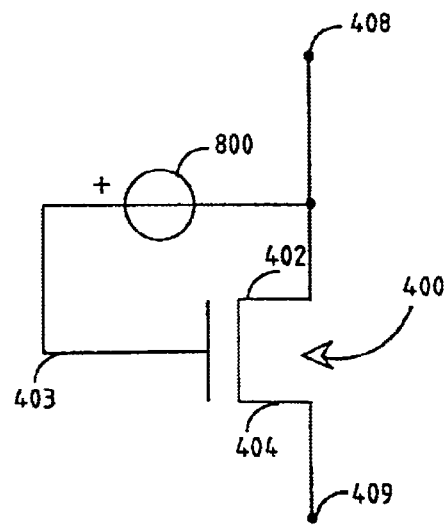
FIG. 8 shows a circuit design comprising a MOS transistor of n-type according to a sixth embodiment of the present invention.

The circuit design of the transistor connected as a diode, here described in different embodiments, is equivalent to that of the FIGS. 7 and 8, in which a voltage generator, respectively 700 and 800, is connected in series to the transistor gate terminals 300 and 400 so as (voltage of opposite sign of that of the threshold voltage) that the total voltage applied to the control terminal (gate) is lower than the threshold voltage of the transistor itself. That is the voltage generator operates at a level translation between the gate control voltage and the voltage directly applied to the gate.

The voltage generator, referring to the FIGS. 5 and 6, includes respectively the block 500 and the 600 and the current generator 310 and 410.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A circuit comprising:
    a first transistor having a control terminal, a first terminal connected to a first potential, a second terminal connected to a second potential;
    a current generator having a third terminal;
    a second transistor having a fourth terminal, a fifth terminal, and a sixth terminal;
    wherein said third terminal is connected to said control terminal, said fourth terminal, and said fifth terminal, and said sixth terminal is connected to said first terminal and wherein the current generator and the second transistor operate such that a first threshold voltage between the first terminal and the second terminal,;to switch the circuit design from a first state to a second state, is lower than a second threshold voltage of the first transistor.

2. A circuit according to claim 1, wherein said first transistor is of the MOS type.

3. A circuit according to claim 2, wherein said first transistor is of the n type, said first terminal corresponds to the drain terminal, said second terminal corresponds to the source terminal and said control terminal corresponds to the gate terminal.

4. A circuit according to claim 2, wherein said first transistor is of the p type, said first terminal corresponds to the drain terminal, said second terminal corresponds to the source terminal and said control terminal corresponds to the gate terminal.

5. A circuit according to claim 1, wherein the first state is a state in which the first transistor is on and the second state is a state wherein the first transistor is off.

6. A circuit according to claim 1, wherein the first state is a state in which the first transistor is off and the second state is a state in which the first transistor is on.

7. A circuit according to claim 1, wherein the first threshold voltage is substantially equal to a difference between the second threshold voltage and a third threshold of the second transistor.

8. An equivalent diode having a first terminal and a second terminal, comprising:
    a first transistor connected between the first terminal and the second terminal and having a control terminal;
    a current generator having a third terminal;
    a second transistor having a fourth terminal, a fifth terminal, and a sixth terminal;
    wherein the third terminal is connected to the control terminal, the fourth terminal and the fifth terminal, and the sixth terminal is connected to the first terminal and wherein the current generator and the second transistor provide a voltage to the first transistor such that a first threshold voltage of the equivalent diode is lower than a second threshold voltage of the first transistor.

* * * * *

UNITED STATES PATENT AND TRADEMARK OFFICE
CERTIFICATE OF CORRECTION

PATENT NO.     : 6,624,683 B1
DATED          : September 23, 2003
INVENTOR(S)    : Lorenzo Bedarida et al.

It is certified that error appears in the above-identified patent and that said Letters Patent is hereby corrected as shown below:

<u>Column 1,</u>
Line 67, should read:
-- will be made evident by the following detailed description --

<u>Column 2,</u>
Line 60, should read:
-- VBB<VAA-VT1 --

<u>Column 6,</u>
Lines 9 and 10, should read:
-- between the first terminal and the second terminal, to switch the circuit from
a first state to a second --

Signed and Sealed this

Twenty-seventh Day of January, 2004

JON W. DUDAS
*Acting Director of the United States Patent and Trademark Office*